US012749354B2

(12) United States Patent
Aiello et al.

(10) Patent No.: US 12,749,354 B2
(45) Date of Patent: Sep. 29, 2026

(54) SYSTEMS AND METHODS FOR MONITORING VEHICLE DIAGNOSTICS

(71) Applicant: United Parcel Service of America, Inc., Atlanta, GA (US)

(72) Inventors: Philip Aiello, Milton, GA (US); Ralph Gallagher, Alpharetta, GA (US)

(73) Assignee: United Parcel Service of America, Inc., Atlanta, GA (US)

( * ) Notice: Subject to any disclaimer, the term of this patent is extended or adjusted under 35 U.S.C. 154(b) by 15 days.

(21) Appl. No.: 18/910,847

(22) Filed: Oct. 9, 2024

(65) Prior Publication Data

US 2025/0037521 A1 Jan. 30, 2025

Related U.S. Application Data

(63) Continuation of application No. 17/717,726, filed on Apr. 11, 2022, now Pat. No. 12,136,302, which is a continuation of application No. 16/891,298, filed on Jun. 3, 2020, now Pat. No. 11,328,541, which is a continuation of application No. 15/984,070, filed on May 18, 2018, now Pat. No. 10,719,997.

(60) Provisional application No. 62/508,451, filed on May 19, 2017.

(51) Int. Cl.
*G07C 5/08* (2006.01)
*G01R 31/00* (2006.01)
*G07C 5/00* (2006.01)

(52) U.S. Cl.
CPC ......... *G07C 5/0808* (2013.01); *G01R 31/007* (2013.01); *G07C 5/008* (2013.01)

(58) Field of Classification Search
None
See application file for complete search history.

(56) References Cited

U.S. PATENT DOCUMENTS

| | | | |
|---|---|---|---|
| 5,966,001 A | 10/1999 | Maehara et al. | |
| 6,472,875 B1 | 10/2002 | Meyer | |
| 10,719,997 B1 | 7/2020 | Aiello et al. | |
| 11,328,541 B2 | 5/2022 | Aiello et al. | |
| 2002/0120386 A1 | 8/2002 | Shi et al. | |
| 2003/0004624 A1 | 1/2003 | Wilson et al. | |
| 2003/0009270 A1* | 1/2003 | Breed .................. | B60N 2/0276 701/32.4 |

(Continued)

FOREIGN PATENT DOCUMENTS

WO 2018/104966 A1 6/2018

*Primary Examiner* — Daniel L Greene
(74) *Attorney, Agent, or Firm* — Shook, Hardy & Bacon L.L.P.

(57) ABSTRACT

Various embodiments provide prognostic vehicle diagnosis methodologies for monitoring the relative health of various vehicle components over time, to enable replacement of those vehicle components prior to component failure. Sensors monitoring those vehicle components transmit generated telematics data to a computing entity configured to generate a telematics data signature based on the sensor-generated data, and to compare the telematics data signature against a reference data signature to ascertain the relative health of the vehicle component. If the telematics data signature satisfies a failure threshold identified within the reference signature, the computing entity initiates a replacement process at least in part by generating an alert for a maintenance personnel.

20 Claims, 6 Drawing Sheets

(56) References Cited

U.S. PATENT DOCUMENTS

| | | | | |
|---|---|---|---|---|
| 2003/0216889 | A1 | 11/2003 | Marko et al. | |
| 2005/0035752 | A1 | 2/2005 | Bertness et al. | |
| 2005/0065711 | A1 | 3/2005 | Dahlgren et al. | |
| 2005/0162172 | A1 | 7/2005 | Bertness | |
| 2009/0043441 | A1 | 2/2009 | Breed | |
| 2009/0138141 | A1* | 5/2009 | Nwadiogbu | G07C 5/085<br>701/31.4 |
| 2013/0113283 | A1 | 5/2013 | Shiek | |
| 2013/0184929 | A1 | 7/2013 | Salman et al. | |
| 2013/0200690 | A1 | 8/2013 | Rini et al. | |
| 2013/0221973 | A1 | 8/2013 | Whisenand et al. | |
| 2014/0052499 | A1 | 2/2014 | Wagner et al. | |
| 2014/0095018 | A1 | 4/2014 | Atluri et al. | |
| 2015/0199854 | A1 | 7/2015 | Olsen et al. | |
| 2016/0285284 | A1 | 9/2016 | Matlapudi et al. | |
| 2016/0292846 | A1* | 10/2016 | Sprock | G06T 7/001 |
| 2017/0372534 | A1* | 12/2017 | Steketee | G06Q 10/087 |
| 2020/0294333 | A1 | 9/2020 | Aiello et al. | |

* cited by examiner

SYSTEMS AND METHODS FOR MONITORING VEHICLE DIAGNOSTICS

CLAIM OF PRIORITY

This application, entitled "Systems and Methods for Monitoring Vehicle Diagnostics," claims priority to U.S. Non-Provisional application Ser. No. 17/717,726, entitled "Systems and Methods for Vehicle Diagnostics" and issued Nov. 5, 2024, as U.S. Pat. No. 12,136,302, which claims priority to U.S. Non-Provisional application Ser. No. 16/891,298, entitled "Systems and Methods for Vehicle Diagnostics" and issued May 10, 2022, as U.S. Pat. No. 11,328,541, which claims priority to U.S. Non-Provisional application Ser. No. 15/984,070, entitled "Systems and Methods for Vehicle Diagnostics" and issued Jul. 21, 2020, as U.S. Pat. No. 10,719,997, which claims priority to Provisional Patent Application No. 62/508,451, filed May 19, 2017, entitled "Systems and Methods for Vehicle Diagnostics," each of which are incorporated herein by reference in their entirety. The subject matter of U.S. patent application Ser. No. 14/667,253 filed Mar. 24, 2015, entitled "Vehicle Maintenance Systems and Methods" and issued May 17, 2016, as U.S. Pat. No. 9,342,933, is related to the subject matter found in this application and is also incorporated by reference herein in its entirety.

BACKGROUND

Modern motor vehicles include numerous components that are impractical to routinely test in order to ensure proper functionality. As a result, many vehicle operators (e.g., individuals and/or companies) simply wait until such components fail prior to replacing and/or repairing these components or, alternatively, routinely repair and/or replace these components according to a preventative maintenance schedule. The former approach may result in the failure of the component during vehicle use, which can lead to damage to other vehicle components, substantial inconvenience with respect to retrieval of the incapacitated vehicle, and an increase in the total time the vehicle is out of service. The latter approach, however, may result in premature replacement and/or repair of the components, thereby increasing the lifetime operating cost of the vehicle.

Accordingly, a need exists for improved systems and methods for diagnosing and/or detecting impending vehicle component failures without requiring a significant vehicle owner time expenditure in order to enable replacement and/or repair of vehicle components immediately prior to an impending vehicle component failure.

BRIEF SUMMARY

Prognostic vehicle component monitoring enables preemptive repair and/or replacement of failing vehicle components identified based on the output characteristics of those vehicle components. Thus, prognostic vehicle component monitoring methodologies incorporate constant or near-constant monitoring of vehicle component output. The monitored vehicle component output is compared against reference vehicle component data that may be utilized to ascertain the relative health of the vehicle component over an expected component lifetime. Once the monitored vehicle component output satisfies a failing component criteria (such as a threshold identified within the reference vehicle component data), a computing entity performing the monitoring initiates a maintenance procedure, such as by alerting maintenance personnel that a particular vehicle component on a particular vehicle is failing.

Certain embodiments are directed to prognostic vehicle diagnostic systems configured for monitoring the relative health of one or more vehicle components. The system may comprise at least one telematics sensor secured within a vehicle and configured to generate telematics data based on output of at least one vehicle component; and a computing entity in wireless communication with the vehicle. The computing entity may be configured to: receive telematics data from the at least one telematics sensor, wherein the telematics data comprises a plurality of telematics data points each indicative of the vehicle component output; store the received telematics data within a telematics data file to form a telematics data signature for the at least one vehicle component; retrieve a performance metric comprising a reference data signature for the at least one vehicle component, wherein the reference data signature identifies a threshold component failure level for the vehicle component; compare the telematics data signature and the reference data signature to determine whether the telematics data signature satisfies the threshold component failure level; and upon determining that the telematics data signature satisfies the threshold component failure level, generate an output notification to initialize a repair procedure for the vehicle component.

The telematics sensor may be a voltage sensor configured to monitor the output voltage of a vehicle alternator, the telematics data may comprise alternator output voltage data and the telematics data signature may identify the alternator voltage output as a function of time, and the reference data signature may identify a reference alternator voltage output as a function of time, and the threshold component failure level may identify an alternator output voltage when the reference alternator failed. However, in certain embodiments the telematics sensor mat be a nitrogen dioxide sensor configured to monitor the nitrogen dioxide level within a vehicle exhaust; the telematics data may comprise nitrogen dioxide output level data and the telematics data signature may identify the nitrogen dioxide output level as a function of time; and the reference data signature may identify a reference nitrogen dioxide output level as a function of time, and the threshold component failure level may identify a nitrogen dioxide output level when the catalytic converter failed.

Certain embodiments are directed to methods for prognostic diagnosis of one or more vehicle components. The method may comprise steps for: generating telematics data via at least one sensor secured within a vehicle and configured to monitor the output of a vehicle component, wherein the telematics data comprises a plurality of telematics data points each indicative of the vehicle component output; storing, via a computing entity in wireless communication with the vehicle, the generated telematics data within a telematics data file to form a telematics data signature for the at least one vehicle component; retrieving, via the computing entity, a performance metric comprising a reference data signature for the at least one vehicle component, wherein the reference data signature identifies a threshold component failure level for the vehicle component; comparing, via the computing entity, the telematics data signature and the reference data signature to determine whether the telematics data signature satisfies the threshold component failure level; and upon determining that the telematics data signature satisfies the threshold component failure level, generating, via the computing entity, an output notification to initialize a repair procedure for the vehicle component.

In various embodiments, the telematics sensor may be a voltage sensor configured to monitor the output voltage of a vehicle alternator, the telematics data may comprise alternator output voltage data and the telematics data signature may identify the alternator voltage output as a function of time, and the reference data signature may identify a reference alternator voltage output as a function of time, and the threshold component failure level may identify an alternator output voltage when the reference alternator failed. However, in certain embodiments the telematics sensor may be a nitrogen dioxide sensor configured to monitor the nitrogen dioxide level within a vehicle exhaust; the telematics data may comprise nitrogen dioxide output level data and the telematics data signature may identify the nitrogen dioxide output level as a function of time; and the reference data signature may identify a reference nitrogen dioxide output level as a function of time, and the threshold component failure level may identify a nitrogen dioxide output level when the catalytic converter failed.

Moreover, various embodiments are directed to a computer program product comprising at least one non-transitory computer-readable storage medium having computer-readable program code portions stored therein, the computer-readable program code portions comprising: an executable portion configured to receive telematics data generated via at least one vehicle sensor secured within a vehicle and configured to monitor the output of a vehicle component, wherein the telematics data comprises a plurality of telematics data points each indicative of the vehicle component output; an executable portion configured to store the generated telematics data within a telematics data file to form a telematics data signature for the at least one vehicle component; an executable portion configured to retrieve a performance metric comprising a reference data signature for the at least one vehicle component, wherein the reference data signature identifies a threshold component failure level for the vehicle component; an executable portion configured to compare the telematics data signature and the reference data signature to determine whether the telematics data signature satisfies the threshold component failure level; and an executable portion configured to, upon determining that the telematics data signature satisfies the threshold component failure level, generate an output notification to initialize a repair procedure for the vehicle component.

In various embodiments, the telematics sensor may be a voltage sensor configured to monitor the output voltage of a vehicle alternator, the telematics data may comprise alternator output voltage data and the telematics data signature may identify the alternator voltage output as a function of time, and the reference data signature may identify a reference alternator voltage output as a function of time, and the threshold component failure level may identify an alternator output voltage when the reference alternator failed. However, in certain embodiments the telematics sensor may be a nitrogen dioxide sensor configured to monitor the nitrogen dioxide level within a vehicle exhaust; the telematics data may comprise nitrogen dioxide output level data and the telematics data signature may identify the nitrogen dioxide output level as a function of time; and the reference data signature may identify a reference nitrogen dioxide output level as a function of time, and the threshold component failure level may identify a nitrogen dioxide output level when the catalytic converter failed.

BRIEF DESCRIPTION OF THE SEVERAL VIEWS OF THE DRAWING(S)

Reference will now be made to the accompanying drawings, which are not necessarily drawn to scale, and wherein.

DESCRIPTION

Figure 1:
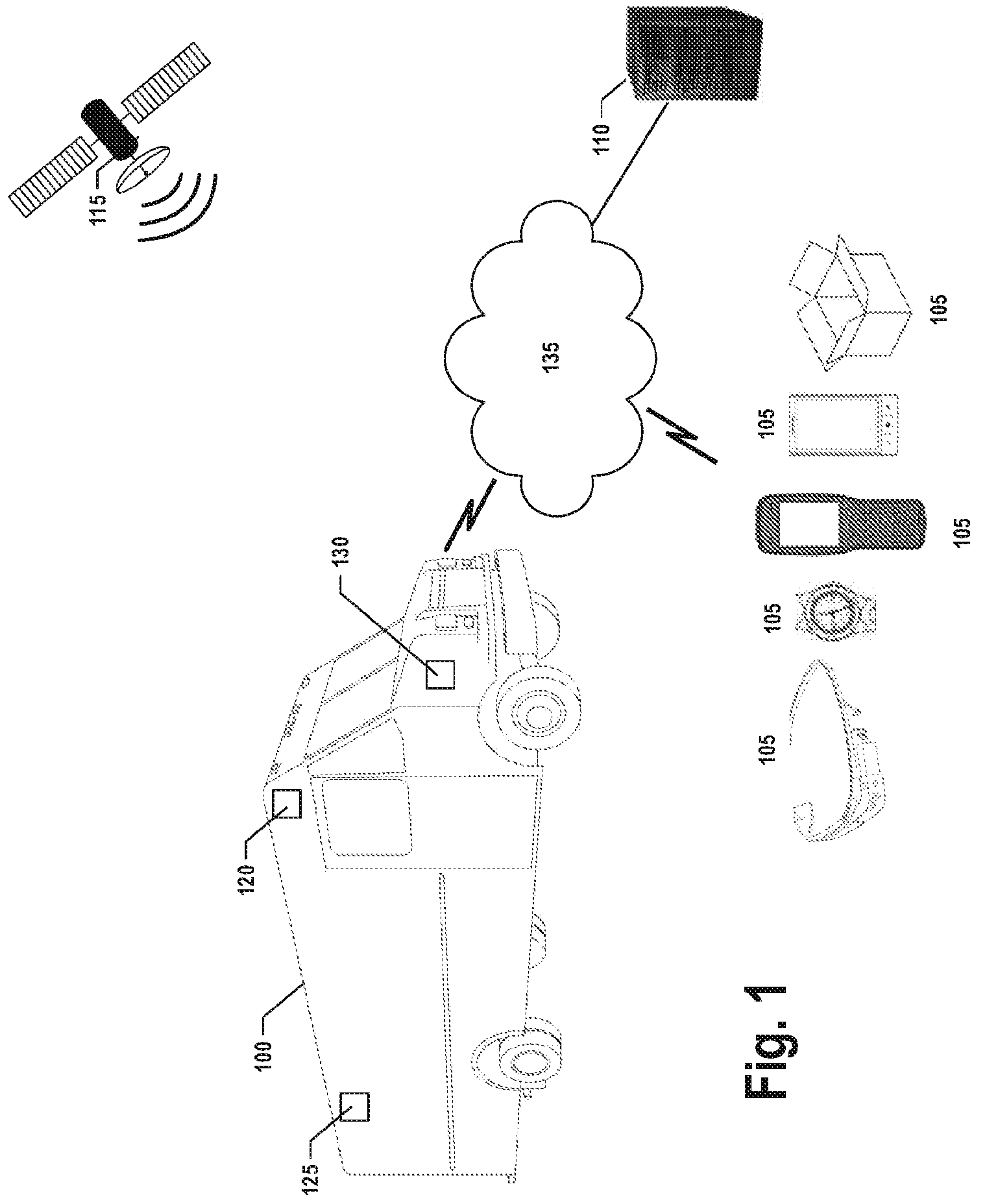
FIG. 1 is a diagram of a system that can be used to practice various embodiments of the present invention.

Various embodiments of the present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. The term "or" is used herein in both the alternative and conjunctive sense, unless otherwise indicated. The terms "illustrative" and "exemplary" are used to be examples with no indication of quality level. Like numbers refer to like elements throughout.

Various embodiments provide systems and methods enabling prognostic vehicle maintenance processes for various vehicles. As discussed herein, prognostic vehicle maintenance may utilize performance data for a vehicle component to determine when the vehicle component is likely to fail. As discussed herein, the performance data may be compared against reference data specific for the vehicle component to estimate an amount of useful component life remaining for the vehicle component. For example, the performance data may be compared against reference data representative of the performance data for an equivalent vehicle component over the entire life cycle of the equivalent vehicle component. Thus, based on the comparison between the performance data and the reference data, various systems may determine the amount of remaining useful life of the vehicle component before the component is likely to fail.

As just one specific example that will be discussed in greater detail herein, performance data for an alternator may comprise a monitored output voltage for the alternator. The monitored output voltage may be compared against reference data indicative of an output voltage of the alternator over the life cycle of the alternator, which may indicate that the output voltage of the alternator will likely trend toward over the life of the alternator before failure. Accordingly, once the monitored output voltage of the alternator is similar to the decreased output voltage of the reference data occurring immediately prior to failure, the alternator may be replaced, thereby avoiding any down time that may result from a failed alternator. The prognostic maintenance processes may be performed automatically while the vehicle is in operation (e.g., while a vehicle is traversing a delivery route) and/or manually by initializing a vehicle diagnostic process operable via a computing entity.

The prognostic maintenance processes may be contrasted against condition-based maintenance or scheduled preventative maintenance. According to condition-based maintenance, the performance of various vehicle components are not specifically monitored, and accordingly vehicle components are serviced (e.g., repaired and/or replaced) after the component fails. According to scheduled preventative maintenance, vehicle components are serviced at scheduled intervals (e.g., according to predefined time periods and/or according to predefined amounts of use), regardless of the actual condition of the vehicle components.

According to various embodiments, systems and methods are provided to enable the identification of one or more vehicle components that are likely to fail in the near future. In particular, the systems and methods described herein enable the identification of one or more vehicle components exhibiting detectable symptoms of impending component failure, such that appropriate remedial action may be taken. In certain embodiments, the system may additionally instigate the appropriate remedial action by, for example, ensuring that appropriate parts, components, and/or the like are available to a vehicle owner and/or service center such that the failing vehicle components may be repaired and/or replaced in a timely manner.

According to various embodiments, monitored vehicles include one or more vehicle mounted sensors (e.g., telematics sensors) configured to collect/capture telematics information/data comprising vehicle component performance data for one or more vehicle components. For example, a battery voltage may be monitored over time, an alternator output may be monitored over time, a starter current may be monitored over time, an engine crank speed (e.g., measured in revolutions per minute (RPM)) may be monitored over time, exhaust emissions from one or more cylinders may be monitored over time, and/or the like. The telematics information/data may be transmitted from the one or more sensors to a computing entity (e.g., a mobile computing entity, an on-board computing entity, a central computing entity (e.g., external to the vehicle), and/or the like. Based on the collected/captured and transmitted telematics information/data, the computing entity may identify a vehicle component for which the telematics information/data applies, and determines one or more performance metrics for the vehicle component. As non-limiting examples, for an alternator, the computing entity may determine that an appropriate performance metric is a threshold value for an output voltage. For a spark plug, the computing entity may determine that an appropriate performance metric is a threshold quantity of nitrogen dioxide in an exhaust flow from a corresponding cylinder. For a starter, the computing entity may determine than an appropriate performance metric is the current drawn by the starter.

Moreover, based on the collected/captured telematics information/data and the identified performance metrics, one or more telematics characteristics may be determined. The telematics characteristics may comprise organized telematics data output (e.g., data output organized as a function of time), summary telematics data (e.g., moving average, average, median, peak, and/or the like), and/or the like. For example, a moving average output voltage of an alternator may be determined, a moving average quantity of nitrogen dioxide in an exhaust flow may be determined, and/or the like.

The determined telematics characteristics may be compared against the determined performance metrics to determine whether the telematics characteristics satisfy the performance metrics. Upon a determination that the telematics characteristics satisfy the applicable performance metrics, various embodiments may continue to monitor the collected/captured telematics information/data. Upon a determination that the telematics characteristics do not satisfy the applicable performance metrics, various embodiments may initiate a maintenance procedure. For example, various embodiments may order replacement and/or repair parts to replace and/or repair the failing vehicle component. In various embodiments, an alert may be generated to the vehicle owner, vehicle operator, a service technician, a fleet manager, and/or the like.

In various embodiments, various calculations, determinations, identifications, and/or the like may be performed by and/or in association with one or more computing entities and/or computer program products. The below "Exemplary System Implementation" section describes various components and/or features of exemplary computing entities according to various embodiments. As just brief examples, such features may be performed by and/or in association with a central computing entity (e.g., a central server), a mobile computing entity (e.g., a handheld device), and/or the like.

FIG. 1 shows an example component monitoring system implemented for monitoring of components on one or more vehicles. As shown in FIG. 1, a vehicle 100 and/or various onboard computing entities (e.g., information/data collection device 130, telematics sensors 125, location sensors 120) are in communication with a central computing entity 110 and/or a mobile computing entity 105 via one or more wired and/or wireless networks 135. Example components of each of these entities are described in greater detail herein. In various embodiments, data indicative of the operating condition of a particular vehicle component may be generated by one or more onboard sensors of the vehicle 100 and may be transmitted to one or more mobile computing devices 105 and/or a central computing device 110 for a determination of whether the collected performance data is indicative of a potentially failing vehicle component.

I. EXEMPLARY SYSTEM OPERATION

Figure 2:
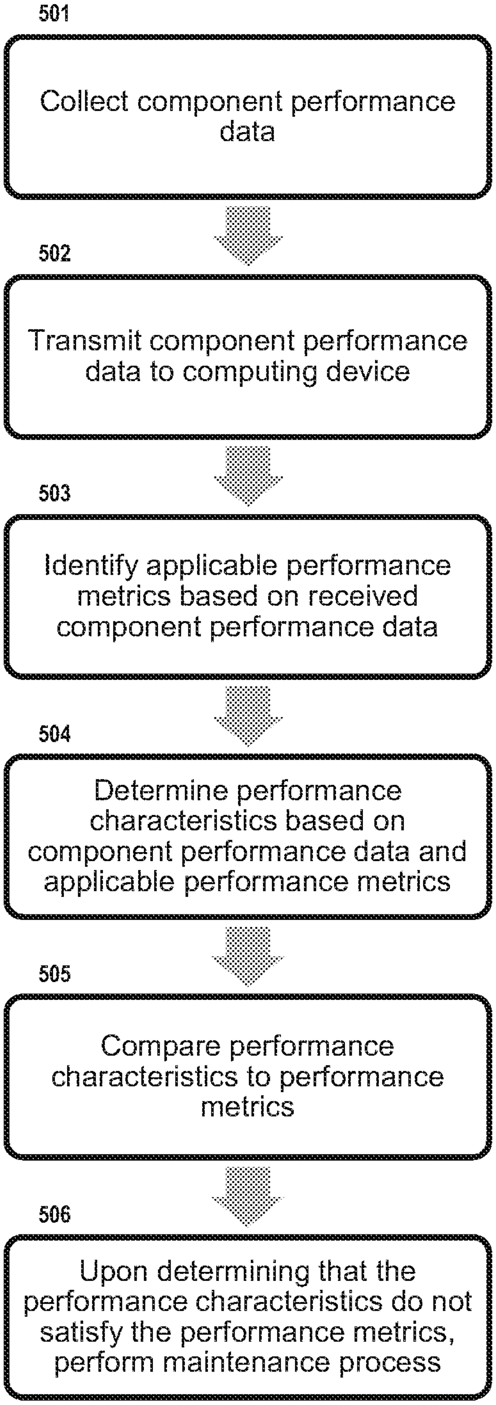
FIG. 2 is a flowchart illustrating operations and processes that can be used in accordance with various embodiments of the present invention.
Figure 3:
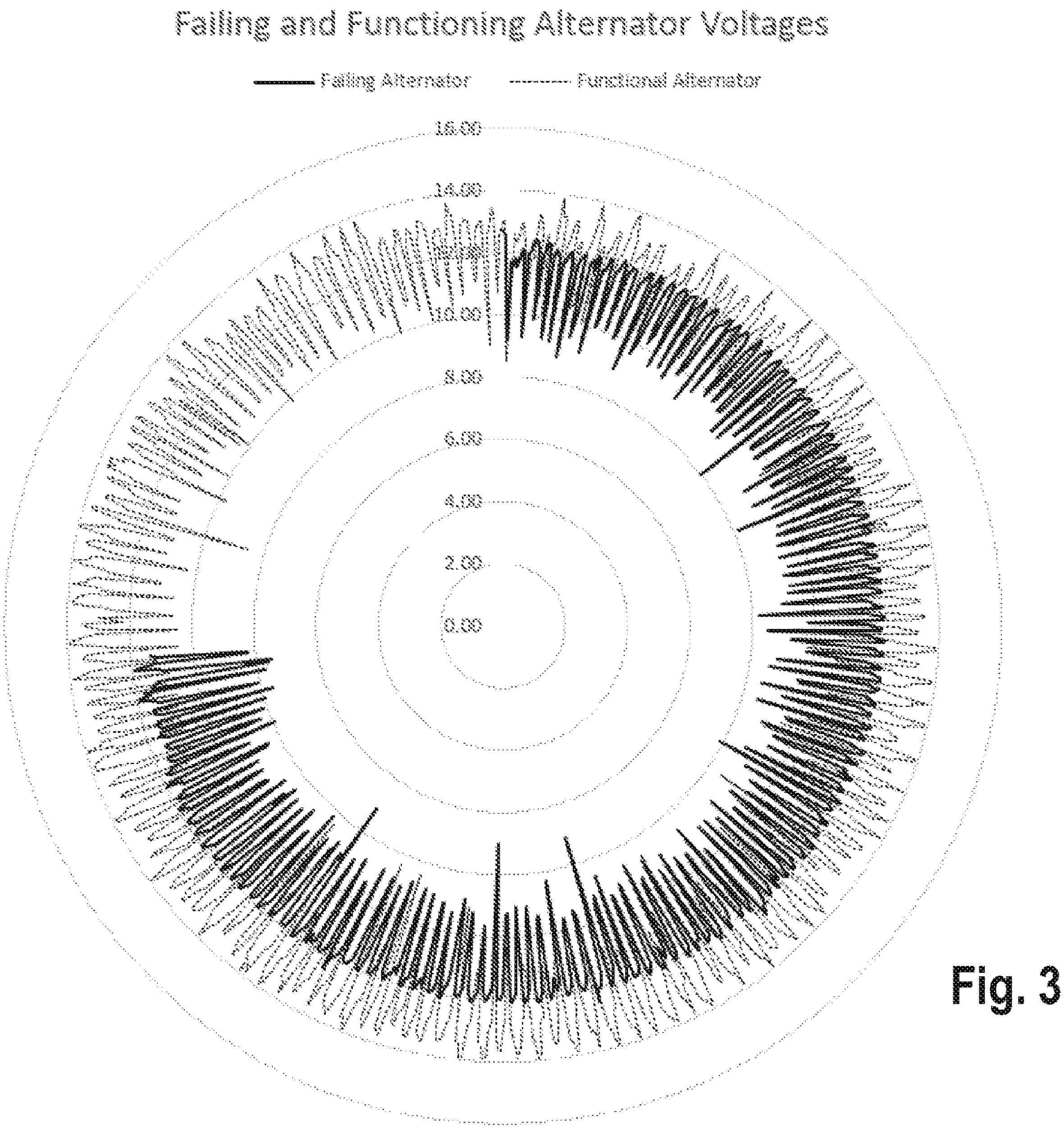
FIG. 3 is an example voltage output indicating a potentially failing vehicle components in accordance with various embodiments of the present invention.

Reference will now be made to FIGS. 2-3. FIG. 2 is a flowchart illustrating operations and processes that can be used in accordance with various embodiments of the present invention. FIG. 3 illustrates exemplary telematics information/data in accordance with various embodiments of the present invention.

As will be discussed in reference to FIGS. 2 and 3, various embodiments are directed to systems and methods for identifying failing vehicle components and for initiating a maintenance procedure to replace and/or repair the same. Accordingly, one or more specifically configured sensors may be configured to collect/capture telematics information/data for one or more vehicle components. For example, a battery voltage sensor may be configured to monitor a battery voltage (e.g., an output voltage) over time. The battery voltage sensor may be secured across the battery output terminals (e.g., physically secured relative to the battery) and/or may be secured within an onboard vehicle electrical circuit incorporating the battery. As another example, the sensors may comprise an in-line current sensor secured within at least a portion of an onboard electrical circuit of a vehicle, and the in-line current sensor may be configured to monitor the amount of current drawn by a starter (and/or other electrical components operable within the vehicle), and/or the like. Based on telematics information/data collected/captured by specifically configured sensors in communication with an information/data collection device 130 (described in greater detail herein), the systems and methods may enable an identification of failing vehicle components before the components become non-operational. For example, sensors specifically configured to monitor an output voltage of an alternator, sensors specifically configured to monitor a stored voltage of a battery, sensors specifically configured to monitor the emissions content of an exhaust flow exiting a particular engine cylinder (e.g., having an integrated catalyst positioned within the exhaust flow), sensors specifically configured to monitor an output voltage and/or current of a vehicle starter, and/or the like may be utilized to collect/capture telematics information/data from applicable vehicle components.

With reference to FIG. 2, a method for identifying failing vehicle components may begin by collecting/capturing component telematics information/data, as shown in Block 501. As noted herein, the component telematics information/data is collected/captured by one or more specially configured sensors (e.g., voltage sensors, emissions sensors, and/or the like) specifically configured to collect/capture telematics information/data for one or more vehicle components. The sensors may be specifically configured to interact with corresponding vehicle components, and accordingly the sensors may comprise one or more mounting brackets, electronic control units (ECU), and/or the like specifically configured such that the sensor may collect/capture telematics information/data from one or more vehicle components. As a specific, non-limiting example, a voltage sensor may comprise one or more ECUs and/or mounting brackets specifically configured such that the voltage sensor may collect/capture output voltage information/data from a vehicle alternator. The sensors may additionally comprise one or more communication interfaces (e.g., wired and/or wireless) configured to enable the sensors to transmit and/or receive electronic data from one or more computing entities, such as a central computing entity 110, a mobile computing entity 105, an information/data collection device 130 onboard the vehicle 100, and/or the like. In certain embodiments, the sensors may be in electronic communication with the information/data collection device 130 via a data bus, such that the sensors may periodically and/or continuously transmit information/data to the information/data collection device 130, as discussed in greater detail herein.

With reference again to Block 501 of FIG. 2, as a specific example of collecting/capturing component telematics information/data, a specifically configured sensor may collect/capture information/data indicative of an output voltage of an alternator. As noted herein, the telematics information/data may be collected/captured periodically, regularly, and/or in response to one or more triggers/events, as discussed herein. In various embodiments, the sensor may be in communication with an onboard storage memory configured to temporarily store the collected/captured telematics information/data. In various embodiments, the sensor may be configured to collect/capture a plurality of information/data points (e.g., over a period of time).

After collecting/capturing the component telematics information/data, in various embodiments the one or more sensors are configured to transmit the collected/captured component telematics information/data to a computing entity (e.g., the information/data collection device 130, the mobile computing entity 105, the central computing entity 110, an onboard computing entity, a user computing entity, and/or the like), as shown in Block 502. In various embodiments, the sensors may be configured to transmit (e.g., via a wired communication protocol and/or a wireless communication protocol) the collected/captured telematics information/data regularly, periodically, in real time (e.g., as each information/data point is collected/captured), in response to a trigger/event (e.g., upon a determination that the vehicle has returned to a vehicle hub), and/or the like. In various embodiments, the sensors may be configured to transmit the collected/captured telematics information/data via one or more other computing devices. For example, the sensor may be configured to transmit the information/data to an onboard computing device (e.g., the information/data collection device 130) and/or a mobile computing device 105 in close proximity to the sensor, and the onboard computing device and/or mobile device 105 may be configured to transmit the information/data to a central computing entity 110.

Once the telematics information/data is received by the computing entity (e.g., central computing entity 110), the computing entity compiles the received telematics information/data into a telematics data file to form a telematics data signature. The telematics data signature is indicative of the operating output of the monitored vehicle component, for example, as a function of time.

With reference again to FIG. 2, the method may continue upon a computing device (e.g., central computing entity 110) identifying applicable performance metrics for the collected/captured component telematics information/data, as shown at Block 503. In certain embodiments, the performance metrics may comprise reference data signatures indicative of the performance of a reference component as a function of time. As discussed herein, the reference data signatures may be compared against the generated telematics data signatures to ascertain whether the monitored vehicle component is operating as expected. Accordingly, the identified performance metrics may identify desirable component operation (e.g., desired vehicle component output), failing component telematics characteristics (e.g., common output characteristics of a failing vehicle component), a vehicle component life-cycle data signature (e.g., identifying characteristics of a reference vehicle component output throughout the vehicle component life-cycle between a moment the component was new to a moment the vehicle component fails), and/or the like. The performance metrics may identify target desirable and/or undesirable operating ranges, tolerances, thresholds, and/or the like for various telematics information/data. For example, the performance metrics may identify a target desirable output voltage for a vehicle alternator (e.g., between 10-15 volts). Upon determining that a telematics information/data output received from the vehicle alternator falls within the target desirable output voltage range, a computing entity (e.g., central computing entity 110) may determine that the vehicle alternator is operating properly. FIG. 3 illustrates an example of a performance metric for an alternator output voltage overlaid with the actual output voltage of a failing alternator. It should be understood that performance metrics may be identified for any of a variety of vehicle components, as discussed in detail herein.

The central computing entity 110 may retrieve applicable performance metrics for the collected/captured component telematics information/data from a storage device accessible to the central computing entity 110 (e.g., a database). The applicable performance metrics may be selected from a plurality of predetermined performance metrics (e.g., a list stored in the database), or the performance metrics may be selected based on the collected/captured information/data types. For example, upon receipt of the component telematics information/data, the central computing entity 110 may be configured to extract information/data from the component telematics information/data indicative of the type of telematics information/data to be reviewed. For example, the central computing entity 110 may be configured to extract information/data indicative of the units to be associated with the component telematics information/data, the source sensor from which the telematics information/data was received, and/or the like. Such information/data may be stored as metadata associated with the component telematics information/data. In certain embodiments, the central computing entity 110 may generate an inquiry to be utilized to retrieve a relevant performance metric based on determined type of telematics information/data to be reviewed. For example, the generated inquiry may be configured to identify an appropriate performance metric to be utilized to evaluate data presented using the retrieved units, to evaluate data retrieved from a particular sensor type, and/or the like. The central computing entity 110 may utilize the generated inquiry to identify a matching performance metric (e.g., providing a performance metric for the type of telematics information/data to be reviewed), and to retrieve the identified matching performance metric for further analysis. For example, each performance metric may be stored with information/data that may be utilized to identify a match between an inquiry and the performance metric. As a specific example, each performance metric may be stored in association with data identifying the types of units that may be reviewed, the type of sensor that may be evaluated, and/or the like.

Moreover, identifying the appropriate performance metrics may comprise identifying the vehicle component for which the telematics information/data is collected/captured. For example, as discussed herein, the telematics information/data may comprise contextual information/data identifying the source component from which the telematics information/data is collected/captured (e.g., an alternator). Based on the collected/captured telematics information/data, the computing entity 110 may be configured to identify appropriate performance metrics. For example, the central computing entity 110 may be configured to detect a threshold value for a moving average voltage output for an alternator. As yet another example, the central computing entity 110 may be configured to identify a threshold amount of nitrogen dioxide found in emissions from a single cylinder (e.g., a minimum amount of nitrogen dioxide).

In various embodiments, the applicable performance metrics may comprise performance metrics for two or more monitored telematics characteristics. For example, the performance metrics for a particular electrical vehicle component may comprise both an output voltage and a current draw for the electrical component. The performance metrics specific to each of the two or more monitored telematics characteristics may be determined independently of one another, such that a determination that the vehicle component does not satisfy one of the telematics characteristics is itself indicative of a failing vehicle component. In yet other embodiments, the performance metrics for various monitored telematics characteristics may be interdependent, such that a relevant electrical component is not indicated as failing unless the telematics characteristics do not satisfy each of a plurality of the relevant performance metrics.

Moreover, one or more performance metrics may be applicable for determining the relative health of more than one vehicle component. For example, a performance metric indicative of a current draw for a vehicle starter may be indicative of the relative health of both the vehicle starter and the vehicle battery. Accordingly, in various embodiments, combinations of multiple performance metrics may be utilized to determine which of a plurality of vehicle components are failing. For example, performance metrics relating to a voltage of a battery and a current drawn by a vehicle starter may be utilized to determine if either of the battery and/or the vehicle starter are currently failing. Following this example, if a battery voltage and a current drawn by a starter are both determined to be indicative a failing vehicle component, the central computing entity 110 may be configured to determine that only the battery is likely failing, thereby effectively attributing improper vehicle starter current draw to the same failing battery component. However, if the battery voltage is determined to satisfy applicable performance metrics, but the starter current draw is indicative of a failing vehicle component, the central computing entity 110 may be configured to determine the vehicle starter is likely failing, but the vehicle battery remains healthy.

With reference again to FIG. 2, the central computing entity 110 may be configured to determine one or more telematics characteristics, as shown in Block 504. As discussed herein, telematics characteristics may comprise organized telematics information/data (e.g., including all collected telematics information/data), summary telematics information/data (e.g., a moving average), and/or the like. In various embodiments, the central computing entity 110 may be configured to determine appropriate types of telematics characteristics based on the collected/captured telematics information/data and the identified appropriate performance metrics. For example, upon a determination that an appropriate performance metric comprises a threshold average voltage output, the central computing entity 110 may be configured to determine a moving average voltage output value based on the collected/captured telematics information/data. As yet another example, upon a determination that an appropriate performance metric comprises a maximum quantity of nitrogen dioxide in an exhaust emission, the central computing entity 110 may be configured to determine an overall maximum detected quantity of nitrogen dioxide as provided in the performance information/data. In various embodiments, the central computing entity 110 may be configured to determine a plurality of telematics characteristics based on the telematics information/data.

As shown at Block 505 of FIG. 2, the central computing entity 110 may be configured to compare the determined telematics characteristics against the identified applicable performance metrics. In various embodiments, the comparison may comprise steps for determining whether the telematics characteristics satisfy applicable performance metrics, as shown at Block 506 of FIG. 5. For example, the comparison may comprise steps for determining whether the telematics characteristics satisfy applicable ranges, tolerances, thresholds, and/or the like with respect to the applicable performance metrics. As discussed herein, the performance metrics may identify desirable performance metrics (in which case the central computing entity 110 may be configured to monitor the telematics characteristics for deviations away from the desirable performance metrics) and/or the performance metrics may identify undesirable performance metrics indicative of a failing vehicle component (in which case the central computing entity 110 may be configured to monitor the telematics characteristics for a match between the telematics characteristics and the performance metrics). Upon determining that the telematics information/data is indicative of a failing vehicle component based on the comparison, the central computing entity 110 may be configured to take one or more remedial actions, as discussed herein.

With reference to FIG. 3, which illustrates an example diagram comparing a voltage output of a failing alternator and a properly functioning alternator, the central computing entity 110 may be configured to compare the telematics characteristics of an alternator against performance metrics comprising a reference alternator output. Upon an identification that the telematics characteristics vary substantially from the reference output (e.g., the telematics characteristics vary by more than a defined value, the telematics characteristics are outside of a predefined range, and/or the like), the central computing entity 110 may be configured to determine that the telematics characteristics do not satisfy the performance metrics.

Upon a determination that the telematics characteristics satisfy the performance metrics, the central computing entity 110 may end the process (e.g., and generate one or more alerts and/or institute a remedial action upon determining that the telematics characteristics satisfy undesirable performance metrics, or take no action upon determining that the telematics characteristics satisfy desirable performance metrics), or may continue monitoring for newly collected/captured telematics information/data in order to repeat the process. As yet another example, the central computing entity 110 may be configured to provide a notification indicating that the telematics information/data indicates that the monitored vehicle components are properly functioning.

Upon a determination that the telematics characteristics are indicative of a failing vehicle component (e.g., the telematics characteristics do not satisfy desirable performance metrics and/or the telematics characteristics satisfy undesirable performance metrics), the central computing entity 110 may institute one or more remedial actions, such as instituting one or more maintenance procedures to facilitate repairing and/or replacing the failing vehicle components. For example, the central computing entity 110 may generate an alert to be received by one or more users (e.g., vehicle owners, vehicle operators, service technicians, and/or the like). Accordingly, upon receipt of an alert that a vehicle component is failing, the users may be notified that the vehicle in question should not be utilized until the vehicle component is repaired and/or replaced.

In various embodiments, the central computing entity 110 may be configured to order one or more replacement parts and/or components in response to a determination that a particular vehicle component is failing. For example, upon a determination that a vehicle alternator is failing, the central computing entity 110 may be configured to automatically order a replacement alternator for the vehicle. Accordingly, the central computing entity 110 may be in communication with one or more vehicle parts suppliers, such that the central computing entity 110 may convey information/data identifying the needed replacement parts to the supplier.

a. Information/Data Collection

In one embodiment, appropriate computing entities (e.g., sensors, information/data collection devices 130, and/or the like) can collect/capture telematics information/data regularly, periodically, continuously, and/or upon determining the occurrence of one or more predefined triggers/events. In another embodiment, the appropriate computing entities can collect/capture telematics information/data in response to certain triggers or events. For example, the information/data collection device 130 can monitor information/data generated by the vehicle sensors (120, 125) for parameters that match predefined triggers/events. In one embodiment, the information/data collection device 130 can monitor some or all the following predefined events: (a) the vehicle 100 being turned on and beginning to idle (e.g., where vehicle sensors 120, 125 indicate the vehicle's engine is turned on and the vehicle speed is zero); (b) the vehicle 100 beginning to move and thereby ceasing to idle (e.g., where the vehicle sensors 120, 125 indicate the vehicle's engine is on and the vehicle's speed has increased from zero to a non-zero value); (c) the vehicle 100 slowing to a stop and beginning to idle (e.g., where the vehicle sensors 120, 125 indicate the vehicle's engine is on and the vehicle's speed has decreased from a non-zero value to zero); (d) the vehicle 100 being turned off and ceasing to idle (e.g., where the vehicle sensors 120, 125 indicate the vehicle's engine is turned off and the vehicle speed is zero); (e) the vehicle 100 moving out of a geo-fenced area; (f) the vehicle 100 moving into a geo-fenced area; (g) the vehicle 100 moving into a geo-fenced area associated with a delivery area assigned to the vehicle 100 and/or its driver; (h) the vehicle 100 moving out of a geo-fenced area associated with a delivery area assigned to the vehicle 100 and/or its driver; (i) the vehicle 100 beginning to move in a reverse direction; (j) the vehicle 100 ceasing to move in a reverse direction; (k) the vehicle's 100 seat belt being engaged or disengaged while the vehicle's 100 engine is on; (l) the vehicle 100 beginning to move in a forward direction; (m) the vehicle 100 ceasing to move in a forward direction; (n) the vehicle 100 traveling above a certain speed; (o) the vehicle 100 being placed in the park position; and/or a variety of other triggers/events.

If a predefined trigger/event is detected, the information/data collection device 130 can capture and store telematics information/data from the vehicle sensors 120, 125. The telematics information/data captured from the sensors 120, 125 may include various types of telematics information/data, including location information/data. For example, the information/data collection device 130 may collect voltage data for a vehicle alternator each time the vehicle is started. The information/data collection device 130 may link this collected information/data with location information/data for the vehicle 100. Should the information/data collection device determine that a vehicle component has failed such that the vehicle is non-operational, the collected information/data may be indicative of the current location of the vehicle 100 such that the vehicle 100 (and vehicle operator) may be retrieved.

If a predefined trigger/event is not detected, the information/data collection device 130 can determine whether a threshold information/data capture time has elapsed. For example, in one embodiment, the threshold information/data capture time can be defined as 30 seconds (or any other time period). If the information/data collection device 130 determines that the threshold information/data capture time has not elapsed, the information/data collection device 130 can continue monitoring for predefined events. However, if the information/data collection device 130 determines that the threshold information/data capture time has elapsed (e.g., more than 30 seconds have passed since the last time that information/data was captured from the vehicle sensors), the information/data collection device 130 can capture telematics information/data.

In one embodiment, the telematics information/data may include contextual information/data collected/captured with the telematics information/data. In another embodiment, contextual information/data can be associated with the collected/captured telematics information/data. The contextual information may comprise metadata associated with the telematics information/data, and/or other information/data that may be usable to distinguish aspects of the For instance, an appropriate computing entity (e.g., mobile computing entity 105) can be configured to collect/capture some or all of the following contextual information/data: (a) the date (e.g., 12/30/2014) and time (e.g., 13:24) the telematics information/data is captured; (b) the driver associated with the mobile computing entity 105 at the time the telematics information/data is captured (e.g., James P. Smith); (c) the vehicle associated with the driver at the time the telematics information/data is captured (e.g., a vehicle identification number such as AS445); (d) the type of telematics information/data captured (e.g., stop status, lunch break); (e) if applicable—a route number and/or stop number associated with the input telematics information/data (e.g., stop 3); (f) the serviceable point associated with the telematics information/data captured; (g) the address associated with the telematics information/data captured; (h) a logged reason for and location of the information/data capture (e.g., a code indicating the detected predefined trigger/event or indicating that the threshold information/data capture time interval elapsed); and/or the like. Further, in one embodiment, an appropriate computing entity (e.g., the information/data collection device 130, the central computing entity 110, the mobile computing entity 105, and/or the like) can be configured to associate the captured telematics information/data with the contextual information/data by, for example, storing fields of telematics information/data captured from the vehicle sensors 120, 125 in the same record, or records, as concurrently captured contextual information/data, thereby associating the two types of information/data if necessary. As discussed herein, such a configuration may enable the system to identify the current location of a vehicle, as well as the type of vehicle and the identity of the driver, upon a determination that a particular vehicle component has failed, thereby rendering the vehicle non-operational. This information/data may thus be used to determine whether to retrieve the vehicle and vehicle operator. Moreover, in certain embodiments, the central computing entity 110 may be configured to store the telematics information/data with information/data indicative of the performance of the vehicle 100 and/or various vehicle components. This data may be stored as historical information/data (e.g., in a storage device in association with the central computing entity 110). In certain embodiments, the historical information/data may be searchable, such that portions of the historical information/data may be provided to a user, for example, in response to a search query.

Moreover, the central computing entity 110 may be configured to utilize the historical information/data to update performance metrics to be applied for future vehicle component monitoring. For example, the performance metrics may be generated based on historical information/data indicative of an anticipated vehicle component failure. Thus, as the central computing entity 110 generates and stores additional historical information/data, the performance metrics may be adjusted to reflect known failure points of components, as evidenced in the historical information/data.

In one embodiment, the information/data collection device 130 can transmit the captured telematics information/data and/or associated contextual information/data to the central computing entity 110 or mobile computing entity 105. This may be accomplished by using any of the transmission methods and systems described herein, as well as other methods, protocols, and systems known in the art. In one embodiment, the information/data collection device 130 can be configured to first attempt to transmit captured information/data to the central computing entity 110, and subsequently attempt to transfer information/data to the mobile computing entity 105 if a connection with the central computing entity 110 is unavailable.

In one embodiment, the mobile computing entity 105 can transmit the captured telematics information/data and/or associated contextual information/data to the central computing entity 110. This may be accomplished by using any of the transmission methods and systems described herein, as well as other methods, protocols, and systems known in the art. In one embodiment, the mobile computing entity 105 can be configured to first attempt to transmit captured information/data to the central computing entity 110, and subsequently attempt to transfer information/data to the information/data collection device 130 if a connection with the central computing entity 110 is unavailable.

II. EXEMPLARY SYSTEM IMPLEMENTATION

As noted herein, various embodiments of the present invention may comprise various steps, features, and/or the like that are executed by and/or with a computer program product that comprises articles of manufacture. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended information/data-out dynamic random access memory (EDO DRAM), synchronous dynamic random access memory (SDRAM), double information/data rate synchronous dynamic random access memory (DDR SDRAM), double information/data rate type two synchronous dynamic random access memory (DDR2 SDRAM), double information/data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory (VRAM), cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Embodiments of the present invention are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices, computing entities, and/or the like carrying out instructions, operations, steps, and similar words used interchangeably (e.g., the executable instructions, instructions for execution, program code, and/or the like) on a computer-readable storage medium for execution. For example, retrieval, loading, and execution of code may be performed sequentially such that one instruction is retrieved, loaded, and executed at a time. In some exemplary embodiments, retrieval, loading, and/or execution may be performed in parallel such that multiple instructions are retrieved, loaded, and/or executed together. Thus, such embodiments can produce specifically-configured machines performing the steps or operations specified in the block diagrams and flowchart illustrations. Accordingly, the block diagrams and flowchart illustrations support various combinations of embodiments for performing the specified instructions, operations, or steps.

III. EXEMPLARY SYSTEM ARCHITECTURE

Referring back to FIG. 1, a system that can be used in conjunction with various embodiments of the present invention is illustrated. As shown in FIG. 1, the system may include one or more vehicles 100, one or more mobile computing entities 105, one or more mapping computing entities 110, one or more Global Positioning System (GPS) satellites 115, one or more location sensors 120, one or more telematics sensors 125, one or more information/data collection devices 130, one or more networks 135, one or more user computing entities (not shown), and/or the like. Each of the components of the system may be in electronic communication with, for example, one another over the same or different wireless or wired networks including, for example, a wired or wireless Personal Area Network (PAN), Local Area Network (LAN), Metropolitan Area Network (MAN), Wide Area Network (WAN), or the like. Additionally, while FIG. 1 illustrates certain system entities as separate, standalone entities, the various embodiments are not limited to this particular architecture.

a. Exemplary Vehicle

In various embodiments, the term vehicle 100 is used generically. For example, a vehicle 100 may be a manned or an unmanned tractor, truck, car, motorcycle, moped, Segway, bicycle, golf cart, hand truck, cart, trailer, tractor and trailer combination, van, flatbed truck, vehicle, drone, airplane, helicopter, boat, barge, and/or any other form of object for moving or transporting people and/or items (e.g., one or more packages, parcels, bags, containers, loads, crates, items banded together, vehicle parts, pallets, drums, the like, and/or similar words used herein interchangeably). In one embodiment, each vehicle 100 may be associated with a unique vehicle identifier (such as a vehicle ID) that uniquely identifies the vehicle 100. The unique vehicle ID (e.g., trailer ID, tractor ID, vehicle ID, and/or the like) may include characters, such as numbers, letters, symbols, and/or the like. For example, an alphanumeric vehicle ID (e.g., "AS445") may be associated with each vehicle 100. In another embodiment, the unique vehicle ID may be the license plate, registration number, or other identifying information/data assigned to the vehicle 100.

Figure 4:
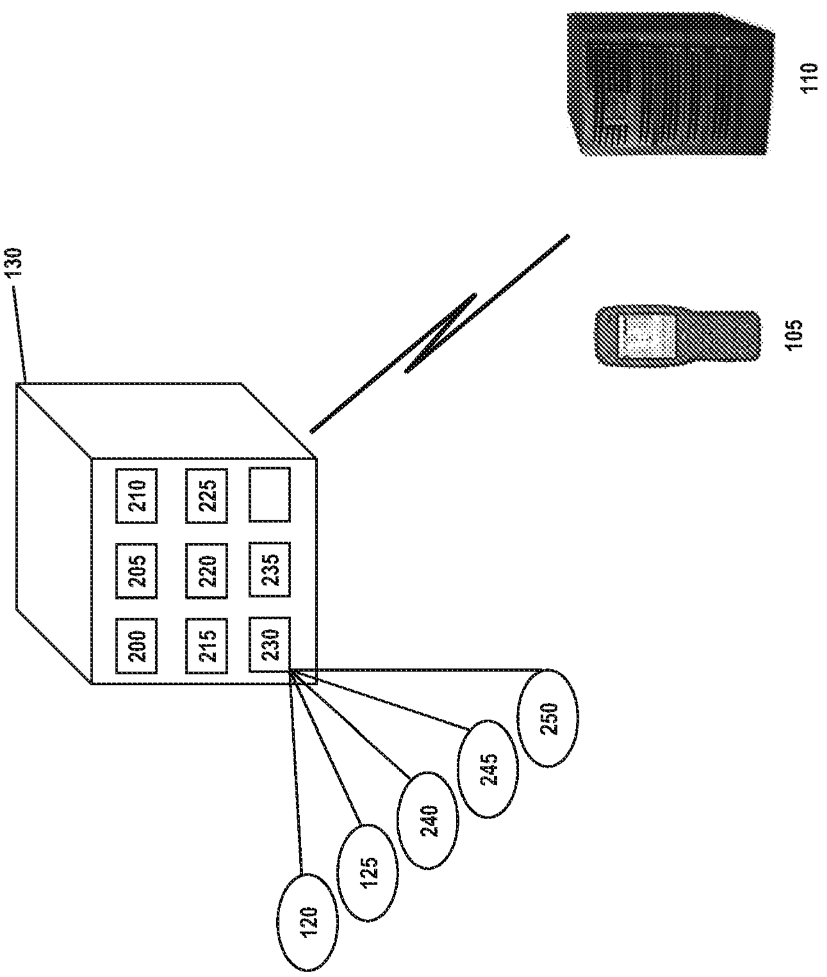
FIG. 4 is a diagram of an information/data collection device that may be used in association with certain embodiments of the present invention.

FIG. 1 shows one or more computing entities, devices, and/or similar words used herein interchangeably that are associated with the vehicle 100, such as an information/data collection device 130 or other computing entities. In general, the terms computing entity, entity, device, system, and/or similar words used herein interchangeably may refer to, for example, one or more computers, computing entities, desktop computers, mobile phones, tablets, phablets, notebooks, laptops, distributed systems, gaming consoles (e.g., Xbox, Play Station, Wii), watches, glasses, iBeacons, proximity beacons, key fobs, radio frequency identification (RFID) tags, ear pieces, scanners, televisions, dongles, cameras, wristbands, wearable items/devices, items/devices, vehicles, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. FIG. 4 provides a block diagram of an exemplary information/data collection device 130 that may be attached, affixed, disposed upon, integrated into, or part of a vehicle 100. The information/data collection device 130 may collect telematics information/data (including location information/data) and transmit/send the information/data to the mobile computing entity 105, the central computing entity 110, and/or various other computing entities via one of several communication methods.

In one embodiment, the information/data collection device 130 may include, be associated with, or be in wired or wireless communication with one or more processors 200 (various exemplary processors are described in greater detail below), one or more location-determining devices or one or more location sensors 120 (e.g., Global Navigation Satellite System (GNSS) sensors), one or more telematics sensors 125, one or more real-time clocks 215, a J-Bus protocol architecture, one or more electronic control modules (ECM) 245, one or more communication ports 230 for receiving telematics information/data from various sensors (e.g., via a CAN-bus), one or more communication ports 205 for transmitting/sending information/data, one or more RFID tags/sensors 250, one or more power sources 220, one or more information/data radios 235 for communication with a variety of communication networks, one or more memory modules 210, and one or more programmable logic controllers (PLC) 225. It should be noted that many of these components may be located in the vehicle 100 but external to the information/data collection device 130.

In one embodiment, the one or more location sensors 120, modules, or similar words used herein interchangeably may be one of several components in wired or wireless communication with or available to the information/data collection device 130. Moreover, the one or more location sensors 120 may be compatible with GPS satellites 115, such as Low Earth Orbit (LEO) satellite systems, Department of Defense (DOD) satellite systems, the European Union Galileo positioning systems, the Chinese Compass navigation systems, Indian Regional Navigational satellite systems, and/or the like. This information/data can be collected using a variety of coordinate systems, such as the Decimal Degrees (DD); Degrees, Minutes, Seconds (DMS); Universal Transverse Mercator (UTM); Universal Polar Stereographic (UPS) coordinate systems; and/or the like. Alternatively, triangulation may be used in connection with a device associated with a particular vehicle and/or the vehicle's operator and with various communication points (e.g., cellular towers or Wi-Fi access points) positioned at various locations throughout a geographic area to monitor the location of the vehicle 100 and/or its operator. The one or more location sensors 120 may be used to receive latitude, longitude, altitude, heading or direction, geocode, course, position, time, and/or speed information/data (e.g., referred to herein as telematics information/data and further described herein below). The one or more location sensors 120 may also communicate with the central computing entity 110, the information/data collection device 130, mobile computing entity 105, and/or similar computing entities.

As indicated, in addition to the one or more location sensors 120, the information/data collection device 130 may include and/or be associated with one or more telematics sensors 125, modules, and/or similar words used herein interchangeably. For example, the telematics sensors 125 may include vehicle sensors, such as engine, fuel, odometer, hubometer, tire pressure, location, weight, emissions, door, and speed sensors. The telematics information/data may include, but is not limited to, speed information/data, emissions information/data, RPM information/data, tire pressure information/data, oil pressure information/data, seat belt usage information/data, distance information/data, fuel information/data, idle information/data, and/or the like (e.g., referred to herein as telematics information/data). The telematics sensors 125 may include environmental sensors, such as air quality sensors, temperature sensors, and/or the like. Thus, the telematics information/data may also include carbon monoxide (CO), nitrogen oxides (NOx), sulfur oxides (SOx), Ethylene Oxide (EtO), ozone ($O_3$), hydrogen sulfide ($H_2S$) and/or ammonium ($NH_4$) information/data, and/or meteorological information/data (e.g., referred to herein as telematics information/data).

In one embodiment, the ECM 245 may be one of several components in communication with and/or available to the information/data collection device 130. The ECM 245, which may be a scalable and subservient device to the information/data collection device 130, may have information/data processing capability to decode and store analog and digital inputs from vehicle systems and sensors. The ECM 245 may further have information/data processing capability to collect and present telematics information/data to the J-Bus (which may allow transmission to the information/data collection device 130), and output standard vehicle diagnostic codes when received from a vehicle's J-Bus-compatible on-board controllers 240 and/or sensors.

As indicated, a communication port 230 may be one of several components available in the information/data collection device 130 (or be in or as a separate computing entity). Embodiments of the communication port 230 may include an Infrared information/data Association (IrDA) communication port, an information/data radio, and/or a serial port. The communication port 230 may receive instructions for the information/data collection device 130. These instructions may be specific to the vehicle 100 in which the information/data collection device 130 is installed, specific to the geographic area in which the vehicle 100 will be traveling, specific to the function the vehicle 100 serves within a fleet, and/or the like. In one embodiment, the information/data radio 235 may be configured to communicate with a wireless wide area network (WWAN), wireless local area network (WLAN), wireless personal area network (WPAN), or any combination thereof. For example, the information/data radio 235 may communicate via various wireless protocols, such as 802.11, general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), 802.16 (WiMAX), ultra wideband (UWB), infrared (IR) protocols, Bluetooth protocols (including Bluetooth low energy (BLE)), wireless universal serial bus (USB) protocols, and/or any other wireless protocol.

b. Exemplary Central Computing Entity

Figure 5:
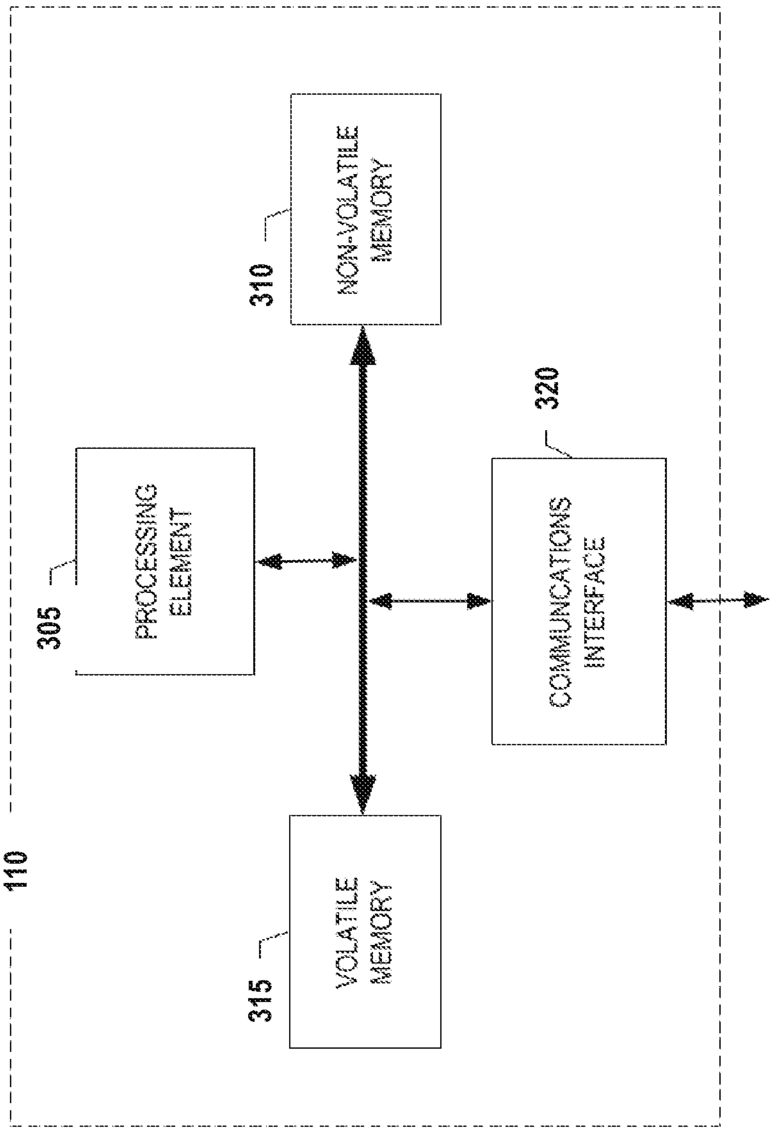
FIG. 5 is a schematic of a central computing entity in accordance with certain embodiments of the present invention.

FIG. 5 provides a schematic of a central computing entity 110 according to one embodiment of the present invention. As indicated, in one embodiment, the central computing entity 110 may also include one or more communications interfaces 320 for communicating with various computing entities, such as by communicating information/data, content, information, and/or similar terms used herein interchangeably that can be transmitted, received, operated on, processed, displayed, stored, and/or the like. For instance, the central computing entity 110 may communicate with vehicles 100, mobile computing entities 105, and/or the like.

As shown in FIG. 5, in one embodiment, the central computing entity 110 may include or be in communication with one or more processing elements 305 (also referred to as processors, processing circuitry, and/or similar terms used herein interchangeably) that communicate with other elements within the central computing entity 110 via a bus, for example. As will be understood, the processing element 305 may be embodied in a number of different ways. For example, the processing element 305 may be embodied as one or more complex programmable logic devices (CPLDs), microprocessors, multi-core processors, coprocessing entities, application-specific instruction-set processors (ASIPs), and/or controllers. Further, the processing element 305 may be embodied as one or more other processing devices or circuitry. The term circuitry may refer to an entirely hardware embodiment or a combination of hardware and computer program products. Thus, the processing element 305 may be embodied as integrated circuits, application specific integrated circuits (ASICs), field programmable gate arrays (FPGAs), programmable logic arrays (PLAs), hardware accelerators, other circuitry, and/or the like. As will therefore be understood, the processing element 305 may be configured for a particular use or configured to execute instructions stored in volatile or non-volatile media or otherwise accessible to the processing element 305. As such, whether configured by hardware or computer program products, or by a combination thereof, the processing element 305 may be capable of performing steps or operations according to embodiments of the present invention when configured accordingly.

In one embodiment, the central computing entity 110 may further include or be in communication with non-volatile media (also referred to as non-volatile storage, memory, memory storage, memory circuitry and/or similar terms used herein interchangeably). In one embodiment, the non-volatile storage or memory may include one or more non-volatile storage or memory media 310 as described above, such as hard disks, ROM, PROM, EPROM, EEPROM, flash memory, MMCs, SD memory cards, Memory Sticks, CBRAM, PRAM, FeRAM, RRAM, SONOS, racetrack memory, and/or the like. As will be recognized, the non-volatile storage or memory media may store information/databases, information/database instances, information/database management system entities, information/data, applications, programs, program modules, scripts, source code, object code, byte code, compiled code, interpreted code, machine code, executable instructions, and/or the like. The term information/database, information/database instance, information/database management system entity, and/or similar terms used herein interchangeably may refer to a structured collection of records or information/data that is stored in a computer-readable storage medium, such as via a relational information/database, hierarchical information/database, and/or network information/database.

In one embodiment, the central computing entity 110 may further include or be in communication with volatile media (also referred to as volatile storage, memory, memory storage, memory circuitry and/or similar terms used herein interchangeably). In one embodiment, the volatile storage or memory may also include one or more volatile storage or memory media 315 as described above, such as RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. As will be recognized, the volatile storage or memory media may be used to store at least portions of the information/databases, information/database instances, information/database management system entities, information/data, applications, programs, program modules, scripts, source code, object code, byte code, compiled code, interpreted code, machine code, executable instructions, and/or the like being executed by, for example, the processing element 305. Thus, the information/databases, information/database instances, information/database management system entities, information/data, applications, programs, program modules, scripts, source code, object code, byte code, compiled code, interpreted code, machine code, executable instructions, and/or the like may be used to control certain aspects of the operation of the central computing entity 110 with the assistance of the processing element 305 and operating system.

As indicated, in one embodiment, the central computing entity 110 may also include one or more communications interfaces 320 for communicating with various computing entities, such as by communicating information/data, content, information, and/or similar terms used herein interchangeably that can be transmitted, received, operated on, processed, displayed, stored, and/or the like. For instance, the central computing entity 110 may communicate with computing entities or communication interfaces of the vehicle 100, mobile computing entities 105, and/or the like.

Such communication may be executed using a wired information/data transmission protocol, such as fiber distributed information/data interface (FDDI), digital subscriber line (DSL), Ethernet, asynchronous transfer mode (ATM), frame relay, information/data over cable service interface specification (DOCSIS), or any other wired transmission protocol. Similarly, the central computing entity 110 may be configured to communicate via wireless external communication networks using any of a variety of protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol. Although not shown, the central computing entity 110 may include or be in communication with one or more input elements, such as a keyboard input, a mouse input, a touch screen/display input, audio input, pointing device input, joystick input, keypad input, and/or the like. The central computing entity 110 may also include or be in communication with one or more output elements (not shown), such as audio output, video output, screen/display output, motion output, movement output, and/or the like.

As will be appreciated, one or more of the central computing entity's 110 components may be located remotely from other central computing entity 110 components, such as in a distributed system. Furthermore, one or more of the components may be combined and additional components performing functions described herein may be included in the central computing entity 110. Thus, the central computing entity 110 can be adapted to accommodate a variety of needs and circumstances.

c. Exemplary Mobile Computing Entity

Figure 6:
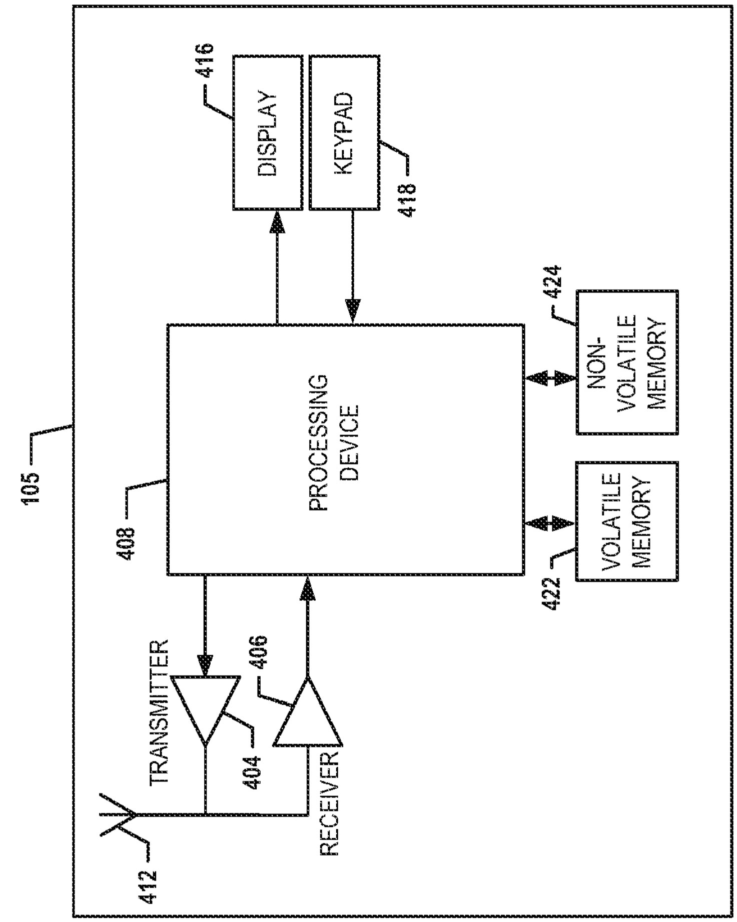
FIG. 6 is a schematic of a mobile computing entity in accordance with certain embodiments of the present invention.

FIG. 6 provides an illustrative schematic representative of a mobile computing entity 105 that can be used in conjunction with embodiments of the present invention. In one embodiment, the mobile computing entities 105 may include one or more components that are functionally similar to those of the central computing entity 110 and/or as described below. As will be recognized, mobile computing entities 105 can be operated by various parties, including operators of vehicles 100. As shown in FIG. 6, a mobile computing entity 105 can include an antenna 412, a transmitter 404 (e.g., radio), a receiver 406 (e.g., radio), and a processing element 408 that provides signals to and receives signals from the transmitter 404 and receiver 406, respectively.

The signals provided to and received from the transmitter 404 and the receiver 406, respectively, may include signaling information/data in accordance with an air interface standard of applicable wireless systems to communicate with various entities, such as vehicles 100, central computing entities 110, and/or the like. In this regard, the mobile computing entity 105 may be capable of operating with one or more air interface standards, communication protocols, modulation types, and access types. More particularly, the mobile computing entity 105 may operate in accordance with any of a number of wireless communication standards and protocols. In a particular embodiment, the mobile computing entity 105 may operate in accordance with multiple wireless communication standards and protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile computing entity 105 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The mobile computing entity 105 can also download changes, add-ons, and updates, for instance, to its firmware, software (e.g., including executable instructions, applications, program modules), and operating system.

According to one embodiment, the mobile computing entity 105 may include location determining aspects, devices, modules, functionalities, and/or similar words used herein interchangeably. For example, the mobile computing entity 105 may include outdoor positioning aspects, such as a location module adapted to acquire, for example, latitude, longitude, altitude, geocode, course, direction, heading, speed, UTC, date, and/or various other information/data. In one embodiment, the location module can acquire information/data, sometimes known as ephemeris information/data, by identifying the number of satellites in view and the relative positions of those satellites. The satellites may be a variety of different satellites, including LEO satellite systems, DOD satellite systems, the European Union Galileo positioning systems, the Chinese Compass navigation systems, Indian Regional Navigational satellite systems, and/or the like. Alternatively, the location information/data may be determined by triangulating the mobile computing entity's 105 position in connection with a variety of other systems, including cellular towers, Wi-Fi access points, and/or the like. Similarly, the mobile computing entity 105 may include indoor positioning aspects, such as a location module adapted to acquire, for example, latitude, longitude, altitude, geocode, course, direction, heading, speed, time, date, and/or various other information/data. Some of the indoor aspects may use various position or location technologies including RFID tags, indoor beacons or transmitters, Wi-Fi access points, cellular towers, nearby computing devices (e.g., smartphones, laptops) and/or the like. For instance, such technologies may include iBeacons, Gimbal proximity beacons, BLE transmitters, Near Field Communication (NFC) transmitters, and/or the like. These indoor positioning aspects can be used in a variety of settings to determine the location of someone or something to within inches or centimeters.

The mobile computing entity 105 may also comprise a user interface (that can include a display 416 coupled to a processing element 408) and/or a user input interface (coupled to a processing element 408). For example, the user interface may be an application, browser, user interface, dashboard, webpage, and/or similar words used herein interchangeably executing on and/or accessible via the mobile computing entity 105 to interact with and/or cause display of information. The user input interface can comprise any of a number of devices allowing the mobile computing entity 105 to receive information/data, such as a keypad 418 (hard or soft), a touch display, voice/speech or motion interfaces, scanners, readers, or other input device. In embodiments including a keypad 418, the keypad 418 can include (or cause display of) the conventional numeric (0-9) and related keys (#, *), and other keys used for operating the mobile computing entity 105 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the mobile computing entity can collect contextual information/data as part of the telematics information/data.

The mobile computing entity 105 can also include volatile storage or memory 422 and/or non-volatile storage or memory 424, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store information/databases, information/database instances, information/database management system entities, information/data, applications, programs, program modules, scripts, source code, object code, byte code, compiled code, interpreted code, machine code, executable instructions, and/or the like to implement the functions of the mobile computing entity 105.

d. Exemplary User Computing Entity

In one embodiment, the user computing entities may each include one or more components that are functionally similar to those of the central computing entity 110 and/or the mobile computing entity 105. For example, in one embodiment, each of the user computing entities may include: (1) a processing element that communicates with other elements via a system interface or bus; (2) a user interface; (3) transitory and non-transitory memory; and (4) a communications interface. As previously noted, the user computing entity may comprise a user interface. For example, the user interface may be an application, browser, user interface, dashboard, webpage, and/or similar words used herein interchangeably executing on and/or accessible via the user computing entity to interact with and/or cause display of information/data from the central computing entity 110 and/or the mobile computing entity 105, as described herein. These architectures are provided for exemplary purposes only and are not limiting to the various embodiments.

IV. CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A system comprising:

a computer-readable storage medium storing instructions; and at least one processor communicatively coupled with the computer-readable storage medium, wherein the at least one processor is configured to execute the instructions to cause the at least one processor to:

collect telematics data from an environmental sensor that generates the telematics data based on an output of a vehicle component, wherein the telematics data (i) comprises telematics data points that are each indicative of the output of the vehicle component as a function of time and (ii) metadata comprising a type of the telematics data collected from the environmental sensor;

extract, based at least in part on the metadata, derivative telematics data indicative of the type of the telematics data collected from the environmental sensor;

identify, based at least in part on the type of the telematics data collected from the environmental sensor and the vehicle component, a performance metric of the vehicle component, wherein the performance metric comprises at least one of a performance range, a performance tolerance, or a performance threshold for the vehicle component and identifies at least one of a desired output, a failing telematics characteristic, or a vehicle component life-cycle data signature;

identify, based at least in part on the performance metric, at least one derivative telematics data characteristic from the derivative telematics data to form a telematics data signature for the vehicle component;

identify a reference data signature for the performance metric of the vehicle component, wherein the reference data signature is indicative of how the vehicle component performs as the function of time for the at least one derivative telematics data characteristic and identifies a failure level for the vehicle component;

compare the telematics data signature and the reference data signature to determine that the telematics data signature satisfies the failure level; and upon determining that the telematics data signature satisfies the failure level, generate an output notification to initialize a repair procedure for the vehicle component.

2. The system of claim 1, wherein, upon determining that the telematics data signature satisfies the failure level, the at least one processor is configured to execute the instructions to cause the at least one processor to order at least one of a replacement part or a repair part for the vehicle component.

3. The system of claim 1, wherein, upon determining that the telematics data signature satisfies the failure level, the at least one processor is configured to execute the instructions to cause the at least one processor to generate an alert to a user indicating that the vehicle component is failing.

4. The system of claim 1, wherein the reference data signature comprises at least one derivative reference data characteristic, and comparing the telematics data signature with the reference data signature comprises comparing the at least one derivative telematics data characteristics with the at least one derivative reference data characteristics.

5. The system of claim 4, wherein the at least one derivative telematics data characteristics comprises a moving average of the telematics data signature.

6. The system of claim 1, wherein the failure level identifies a range of the derivative telematics data indicative of the vehicle component failing.

7. The system of claim 1, wherein the failure level identifies a tolerance for the derivative telematics data indicative of the vehicle component failing.

8. The system of claim 1, wherein the failure level identifies a threshold for the derivative telematics data indicative of the vehicle component failing.

9. A method comprising:

collecting, by at least one computing entity, telematics data from a vehicle mounted sensor that generates the telematics data based on an output of a vehicle component, wherein the telematics data (i) comprises telematics data points that are each indicative of the output of the vehicle component as a function of time and (ii) metadata comprising a type of the telematics data collected from the vehicle mounted sensor;

extracting, by the at least one computing entity and based at least in part on the metadata, derivative telematics data indicative of the type of the telematics data collected from the vehicle mounted sensor;

identifying, by the at least one computing entity and based at least in part on the type of the telematics data collected from the vehicle mounted sensor and the vehicle component, a performance metric of the vehicle component, wherein the performance metric comprises at least one of a performance range, a performance tolerance, or a performance threshold for the vehicle component and identifies at least one of a desired output, a failing telematics characteristic, or a vehicle component life-cycle data signature;

identifying, by the at least one computing entity and based at least in part on the performance metric, at least one derivative telematics data characteristic from the derivative telematics data to form a telematics data signature for the vehicle component;

identifying, by the at least one computing entity, a reference data signature for the performance metric of the vehicle component, wherein the reference data signature is indicative of how the vehicle component performs as the function of time for the at least one derivative telematics data characteristic and identifies a failure level for the vehicle component;

comparing, by the at least one computing entity, the telematics data signature and the reference data signature to determine that the telematics data signature satisfies the failure level; and upon determining that the telematics data signature satisfies the failure level, generating, by the at least one computing entity, an output notification to initialize a repair procedure for the vehicle component.

10. The method of claim 9, wherein, upon determining that the telematics data signature satisfies the failure level, the method further comprises ordering at least one of a replacement part or a repair part for the vehicle component.

11. The method of claim 9, wherein, upon determining that the telematics data signature satisfies the failure level, the method further comprises generating an alert to a user indicating that the vehicle component is failing.

12. The method of claim 9, wherein the reference data signature comprises at least one derivative reference data characteristics, and comparing the telematics data signature with the reference data signature comprises comparing the at least one derivative telematics data characteristics with the at least one derivative reference data characteristics.

13. The method of claim 12, wherein the at least one derivative telematics data characteristics comprises a moving average of the telematics data signature.

14. The method of claim 9, wherein the failure level identifies a range of the derivative telematics data indicative of the vehicle component failing.

15. The method of claim 9, wherein the failure level identifies a tolerance for the derivative telematics data indicative of the vehicle component failing.

16. The method of claim 9, wherein the failure level identifies a threshold for the derivative telematics data indicative of the vehicle component failing.

17. A computer-readable storage medium storing computer-executable instructions that, when executed by at least one computing entity, configure the at least one computing entity to perform operations comprising:

collecting data from a sensor that generates the data based on an output of a vehicle component, wherein the data (i) comprises data points that are each indicative of the output of the vehicle component as a function of time and (ii) metadata comprising a type of the data collected from the sensor;

extracting, based at least in part on the metadata, derivative data indicative of the type of the data collected from the sensor;

identifying, based at least in part on the type of the data collected from the sensor and the vehicle component, a performance metric of the vehicle component, wherein the performance metric comprises at least one of a performance range, a performance tolerance, or a performance threshold for the vehicle component;

identifying, based at least in part on the performance metric, at least one data characteristic from the derivative data to form a data signature for the vehicle component;

identifying a reference data signature for the performance metric of the vehicle component, wherein the reference data signature is indicative of how the vehicle component performs as the function of time for the at least one data characteristic and identifies a failure level for the vehicle component;

comparing the data signature and the reference data signature to determine that the data signature satisfies the failure level; and upon determining that the data signature satisfies the failure level, generating an output notification to initialize a repair procedure for the vehicle component.

18. The computer-readable storage medium of claim 17, wherein the failure level identifies a range of the derivative data indicative of the vehicle component failing.

19. The computer-readable storage medium of claim 17, wherein the failure level identifies a tolerance for the derivative data indicative of the vehicle component failing.

20. The computer-readable storage medium of claim 17, wherein the failure level identifies a threshold for the derivative data indicative of the vehicle component failing.

* * * * *